(12) United States Patent
Kijima et al.

(10) Patent No.: US 10,243,134 B2
(45) Date of Patent: Mar. 26, 2019

(54) PIEZOELECTRIC FILM AND PIEZOELECTRIC CERAMICS

(71) Applicant: Advanced Material Technologies, Inc., Chiba (JP)

(72) Inventors: Takeshi Kijima, Chiba (JP); Yasuaki Hamada, Chiba (JP); Takeshi Nomura, Chiba (JP)

(73) Assignee: ADVANCED MATERIAL TECHNOLOGIES, INC., Chiba (JP)

( * ) Notice: Subject to any disclaimer, the term of this patent is extended or adjusted under 35 U.S.C. 154(b) by 555 days.

(21) Appl. No.: 14/963,359

(22) Filed: Dec. 9, 2015

(65) Prior Publication Data

US 2016/0190429 A1    Jun. 30, 2016

(30) Foreign Application Priority Data

Dec. 26, 2014    (JP) .................. 2014-264245

(51) Int. Cl.
*H01L 41/187*    (2006.01)
*H01L 41/08*    (2006.01)
*H01L 41/047*    (2006.01)
*H01L 41/318*    (2013.01)

(52) U.S. Cl.
CPC ...... *H01L 41/0805* (2013.01); *H01L 41/1876* (2013.01); *H01L 41/0478* (2013.01); *H01L 41/318* (2013.01)

(58) Field of Classification Search
CPC ............. H01L 41/0805; H01L 41/1876; H01L 41/187; H01L 41/193

USPC ....... 310/358; 501/134; 252/62.9 PZ, 62.9 R
See application file for complete search history.

(56) References Cited

U.S. PATENT DOCUMENTS

2008/0048227 A1*  2/2008  Hwang ............ H01L 21/31691
                                                                257/295
2010/0109807 A1*  5/2010  Iwanami ................ H01P 1/203
                                                                333/185

FOREIGN PATENT DOCUMENTS

| JP | 03-108192 A | * | 5/1991 | ............ G01C 11/42 |
| JP | 2003-81694 | | 3/2003 | |
| JP | 2008-265289 | | 11/2008 | |
| JP | 2013-251490 | | 12/2013 | ........... H01L 21/316 |
| JP | 2014-187362 | | 10/2014 | |
| JP | 2016-127057 | * | 7/2016 | ........... H01L 41/187 |
| WO | WO-2017/027744 A1 | * | 2/2017 | ............. H01L 21/02 |

* cited by examiner

*Primary Examiner* — Thomas Dougherty
(74) *Attorney, Agent, or Firm* — Wenderoth, Lind & Ponack, L.L.P.

(57) ABSTRACT

An object is to cause a piezoelectric film to perform a piezoelectric operation at a higher voltage than the conventional piezoelectric film. An aspect of the present invention is a piezoelectric film, wherein a voltage at which a piezoelectric butterfly curve that is a result obtained by measuring a piezoelectric property of a piezoelectric film takes a minimum value is larger by 2 V or more than a coercive voltage of a hysteresis curve that is a result obtained by measuring a hysteresis property of said piezoelectric film. The piezoelectric film includes an anti-ferroelectric film, and a ferroelectric film formed on the anti-ferroelectric film.

13 Claims, 12 Drawing Sheets

FIG. 5C

| BIPOLAR 700Hz | Input:-2.5V to 2.5V | | Input:-5V to 5V | | Input:-10V to 10V | |
|---|---|---|---|---|---|---|
| Sample No. | LDV S/T amp(nm) | As 100% d31(pm/V) | LDV S/T amp(nm) | As 100% d31(pm/V) | LDV S/T amp(nm) | As 100% d31(pm/V) |
| 1 | 261 | 127 | 444 | 128 | 944 | 130 |
| 2 | 270 | 130 | 944 | 132 | 998 | 134 |
| 3 | 277 | 135 | 948 | 135 | 950 | 130 |
| 4 | 267 | 128 | 967 | 137 | 999 | 138 |
| 5 | 275 | 133 | 970 | 135 | 990 | 135 |

PIEZOELECTRIC FILM AND PIEZOELECTRIC CERAMICS

BACKGROUND OF THE INVENTION

Field of the Invention

The present invention relates to a piezoelectric film and piezoelectric ceramics.

Background Art

FIG. 8(A) is a graph showing a DE hysteresis curve and a piezoelectric butterfly curve of a Pb(Zr, Ti)$O_3$ film (hereinafter, referred to as "PZT film") having a thickness of 2 μm, and FIG. 8(B) is a graph showing the DE hysteresis curve and the piezoelectric butterfly curve of the PZT film having a thickness of 4 μm.

The PZT films having thicknesses of 2 μm and 4 μm are produced in the following way.

A Pt film oriented in the (100) plane on a wafer of 4 inches, and on the Pt film a PZT film is formed by a sputtering method (for example, refer to Patent Literature 1). One example of the sputtering conditions is as follows. By controlling a film forming time of the PZT film, Sample 1 in which the PZT film having a thickness of 2 μm and Sample 2 in which the PZT film having a thickness of 4 μm are produced. Then, the evaluation of hysteresis and the evaluation of piezoelectric butterfly of each PZT film of Sample 1 and Sample 2 are performed.

[Sputtering Conditions]
Machine: RF Magnetron sputtering apparatus
Power: 1500 W
Gas: Ar/$O_2$
Pressure: 0.14 Pa
Temperature: 600° C.
Film forming rate: 0.63 nm/sec FIG. 9 is a graph which is the same as of FIG. 8(A) and which shows that the voltage at which the piezoelectric butterfly curve takes the minimum value is almost the same as the coercive voltage Vc of the DE hysteresis curve. It can be read from FIG. 8(B) that the voltage at which the piezoelectric butterfly curve also takes the minimum value is almost the same as the coercive voltage Vc of the DE hysteresis curve. In this way, according to the conventional piezoelectric film, the piezoelectric butterfly (mechanical vibration) property and the ferroelectric hysteresis property (movement of electrons) are almost the same.

FIG. 10(A) is a graph showing the piezoelectric hysteresis curve obtained by applying a voltage of ±5 V, 700 Hz to a PZT film having a thickness of 2 μm (Sample 1) and thus causing the film to perform bipolar driving, and FIG. 10(B) is a graph showing the piezoelectric hysteresis curve obtained by applying a voltage of ±10 V, 700 Hz to a PZT film having a thickness of 2 μm (Sample 1) and thus causing the film to perform bipolar driving.

When applying a voltage of ±5 V which is not larger than the coercive voltage Vc of the DE hysteresis curve to the PZT film having a thickness of 2 μm shown in FIG. 8(A) and thus causing the film to perform bipolar driving, the piezoelectric hysteresis property shows the linear behavior as shown in FIG. 10(A). However, when applying a voltage of ±10 V which is larger than the coercive voltage Vc of the DE hysteresis curve to the PZT film having a thickness of 2 μm shown in FIG. 8(A) and thus causing the film to perform bipolar driving, an electrostrictive factor is included in the piezoelectric hysteresis property as shown in FIG. 10(B).

FIG. 11(A) is a graph showing the piezoelectric hysteresis curve obtained by applying a voltage of ±5 V, 700 Hz to a PZT film having a thickness of 4 μm (Sample 2) and thus causing the film to perform bipolar driving, and FIG. 11(B) is a graph showing the piezoelectric hysteresis curve obtained by applying a voltage of ±10 V, 700 Hz to a PZT film having a thickness of 4 μm (Sample 2) and thus causing the film to perform bipolar driving.

When applying a voltage of ±10 V which is not larger than the coercive voltage Vc of the DE hysteresis curve to the PZT film having a thickness of 4 μm shown in FIG. 8(B) and thus causing the film to perform bipolar driving, the piezoelectric hysteresis property shows the linear behavior as shown in FIG. 11(B). In other words, even at a high voltage of ±10 V at which the electrostrictive factor is included in the piezoelectric hysteresis property in the case of a thickness of 2 μm by making a thickness of the PZT film as large as 4 μm, it becomes possible to cause the film to perform bipolar driving in which the piezoelectric hysteresis property shows linear behavior. Namely, in order to cause the conventional piezoelectric film to perform a piezoelectric operation at a high voltage, it is necessary to make the film thickness large for gaining the coercive voltage Vc.

DESCRIPTION OF A RELATED ART

Patent Document

[Patent Document 1] JP 2013-251490 A

SUMMARY OF THE INVENTION

Problem to be Solved by the Invention

According to the conventional piezoelectric film, the piezoelectric operation can be performed at a voltage not exceeding the coercive voltage.

An object of one aspect of the present invention is to cause the piezoelectric operation at a higher voltage than the conventional piezoelectric film.

Means to Solve the Problem

Hereinafter, various aspects according to the present invention will be explained.

[1] A piezoelectric film, wherein a voltage at which a piezoelectric butterfly curve that is a result obtained by measuring a piezoelectric property of a piezoelectric film takes a minimum value is larger by 2 V or more (preferably 4 V or more, more preferably 7 V or more, and further preferably 10 V or more) than a coercive voltage of a hysteresis curve that is a result obtained by measuring a hysteresis property of the piezoelectric film.

[2] The piezoelectric film according to the above [1], wherein the piezoelectric film includes an anti-ferroelectric film, and a ferroelectric film formed on the anti-ferroelectric film.

[3] The piezoelectric film according to the above [2], wherein the anti-ferroelectric film is a Pb(Zr$_{1-A}$Ti$_A$)$O_3$ film, the ferroelectric film is a Pb(Zr$_{1-x}$Ti$_x$)$O_3$ film, and the A and said x satisfy the following Formula 1 and Formula 2;

$$0 \leq A \leq 0.1 \qquad \text{Formula 1}$$

$$0.1 < x < 1. \qquad \text{Formula 2}$$

Note that the Pb(Zr$_{1-x}$Ti$_x$)$O_3$ film may be formed by laminating a plurality of Pb(Zr, Ti)$O_3$ films.

[4] The piezoelectric film according to the above [3], wherein the Pb(Zr$_{1-x}$Ti$_x$)$O_3$ film is a film which is formed by laminating a plurality of the Pb(Zr, Ti)O$_3$ films having different Zr/Ti ratios, and a ratio of Zr to Ti in the whole of the laminated films satisfies the following Formula 3;

$$55/45 \leq Zr/Ti. \qquad \text{Formula 3}$$

[5] The piezoelectric film according to the above [4], wherein, when a thickness of the laminated films is less than 1.0 μm, the ratio of Zr to Ti in the whole of the laminated films satisfies the following Formula 4, and when a thickness of the laminated films is 1.0 μm or more, the ratio of Zr to Ti in the whole of the laminated films satisfies the following Formula 5;

$$55/45 \leq Zr/Ti \leq 65/35 \qquad \text{Formula 4}$$

$$60/40 \leq Zr/Ti \leq 75/25. \qquad \text{Formula 5}$$

[6] The piezoelectric film according to any one of the above [3] to [5], wherein
the A is 0, and
the Pb(Zr$_{1-A}$Ti$_A$)O$_3$ is a PbZrO$_3$ film.

[7] The piezoelectric film according to any one of the above [1] to [6], wherein an element having the piezoelectric film can be caused to perform bipolar driving at a frequency of 100 Hz or more (preferably 500 Hz or more).

[8] Piezoelectric ceramics comprising:
the piezoelectric film according to any one of the above [3] to [7], and
an oxide film formed under the Pb(Zr$_{1-A}$Ti$_A$)O$_3$ film.

Note that the oxide film is preferably an oxide having a perovskite structure.

[9] The piezoelectric ceramics according to the above [8], wherein the oxide film is a SrRuO$_3$ film or a Sr(Ti, Ru)O$_3$ film.

Note that the Sr(Ti, Ru)O$_3$ film is preferably a Sr(Ti$_{1-x}$Ru$_x$)O$_3$ film, and the x satisfies the following Formula 14;

$$0.01 \leq x \leq 0.4. \qquad \text{Formula 14}$$

[10] The piezoelectric ceramics according to the above [8] or [9], further including an electrode film formed under the Pb(Zr$_{1-A}$Ti$_A$)O$_3$ film.

[11] The piezoelectric ceramics according to the above [10], wherein the electrode film is formed of an oxide or a metal.

Note that the oxide film may be a SrRuO$_3$ film or a Sr(Ti$_{1-x}$Ru$_x$)O$_3$ film, and the x satisfies the following Formula 14;

$$0.01 \leq x \leq 0.4. \qquad \text{Formula 14}$$

[12] The piezoelectric ceramics according to the above [10] or [11], wherein the electrode film is a Pt film or an Ir film.

Note that the Pt film is oriented in the (100) plane.

[13] The piezoelectric ceramics according to any one of the above [10] to [12], further including a ZrO$_2$ film formed under the electrode film.

Note that the ZrO$_2$ film is oriented in the (100) plane.

[14] The piezoelectric ceramics according to the above [13], further including a Si substrate formed under the ZrO$_2$ film.

Note that the Si substrate is oriented in the (100) plane.

Meanwhile, in the above various aspects according to the present invention, when the specific C (hereinafter, referred to as "C") is formed (C is provided) on (or under) the specific B (hereinafter, referred to as "B"), such a case is not limited to the case where C is formed (C is provided) directly on (or under) B, but includes the case where C is formed (C is provided) on (or under) B via other element within a scope not inhibiting the working effects in one aspect of the present invention.

Effect of the Invention

It becomes possible to cause the piezoelectric film to perform a piezoelectric operation at a higher voltage than conventional piezoelectric film, by applying one aspect of the present invention.

BRIEF DESCRIPTION OF THE DRAWINGS

FIG. 5A, FIG. 5B, FIG. 5C and FIG. 5D are graphs and the like showing the DE hysteresis curve and the piezoelectric butterfly curve of the piezoelectric film of Sample 1 according to the Example.

DESCRIPTION OF THE PREFERRED EMBODIMENTS

Hereinafter, embodiments and Examples of the present invention will be explained in detail using the drawings. However, a person skilled in the art would be able to easily understand that the present invention is not limited to the following explanations but forms and details thereof may be variously modified without deviating from the purport and the scope of the present invention. Accordingly, the present invention is not to be construed as being limited to the description of the embodiments and Examples, shown below.

The piezoelectric film according to one aspect of the present invention is a piezoelectric film, in which a voltage at which a piezoelectric butterfly curve that is a result obtained by measuring a piezoelectric property of a piezoelectric film takes a minimum value is larger by 2 V or more (preferably 4 V or more, more preferably 7 V or more, and further preferably 10 V or more) than a coercive voltage of a hysteresis curve that is a result obtained by measuring a hysteresis property of the piezoelectric film. Thereby, it becomes possible to cause the piezoelectric film to perform a piezoelectric operation at a high voltage even when the thickness of the piezoelectric film is thin.

The above piezoelectric film can be realized by the piezoelectric films according to the following embodiments.

[First Embodiment]

Figure 1:
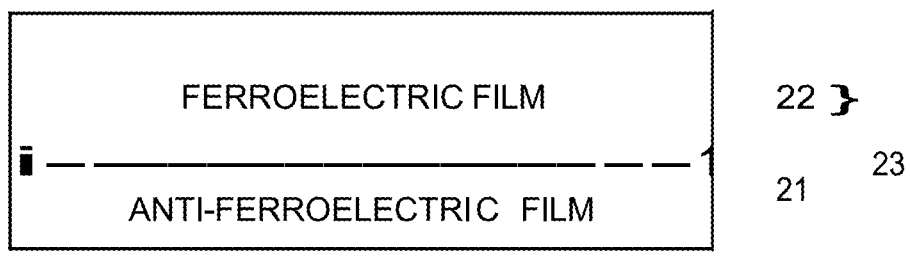
FIG. 1 is a schematic cross-sectional view showing a piezoelectric film according to one aspect of the present invention.

FIG. 1 is a schematic cross-sectional view showing the piezoelectric film according to one aspect of the present invention.

A piezoelectric film 23 has an anti-ferroelectric film 21, and a ferroelectric film 22 formed on the anti-ferroelectric film 21.

Figure 2A:
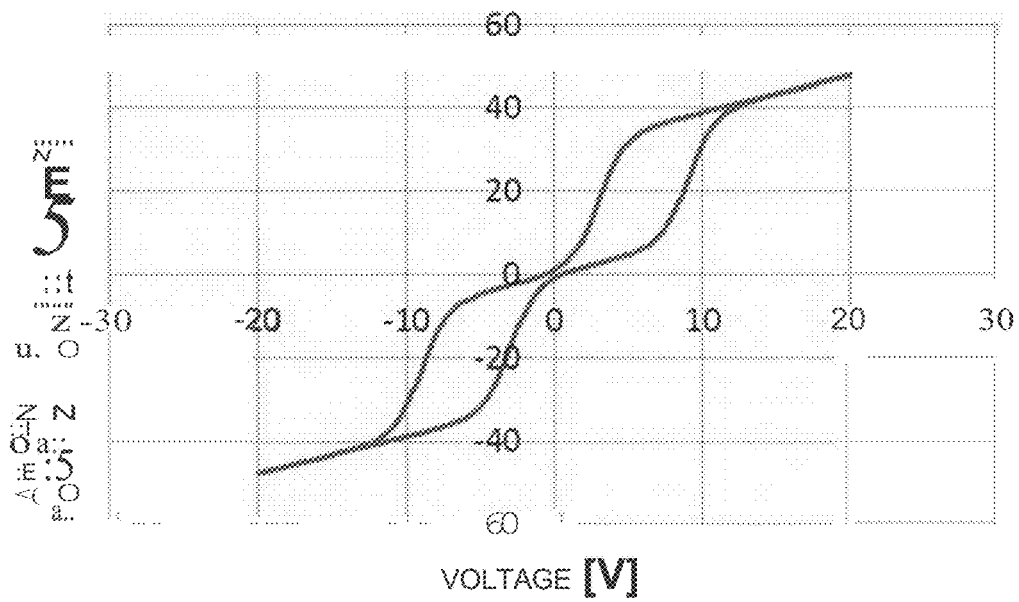
FIG. 2(A) is a graph schematically showing a DE hysteresis curve of the anti-ferroelectric film 21 shown in FIG. 1.
Figure 2B:
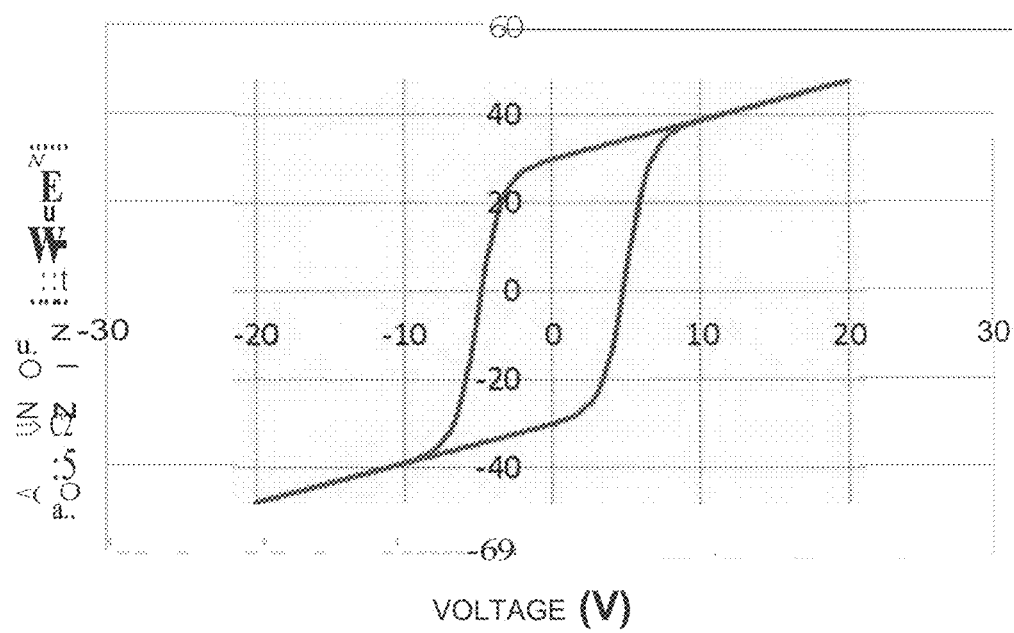
FIG. 2(B) is a graph schematically showing the DE hysteresis curve of the ferroelectric film 22 shown in FIG. 1.

FIG. 2(A) is a graph showing a DE hysteresis curve of the anti-ferroelectric film 21 shown in FIG. 1, and FIG. 2(B) is a graph showing a DE hysteresis curve of the ferroelectric film 22 shown in FIG. 1.

In the case of measuring the piezoelectric property of the piezoelectric film 23 and measuring the hysteresis property of the piezoelectric film 23, the voltage at which the piezoelectric butterfly curve takes a minimum value can be made larger than the coercive voltage Vc of the hysteresis curve since the ferroelectric film 22 is disposed on the anti-ferroelectric film 21. Namely, even if a voltage which is larger than the coercive voltage Vc of the hysteresis curve of the piezoelectric film 23 is applied, it is possible to cause the piezoelectric film 23 to perform bipolar driving without including an electrostrictive factor in the piezoelectric hysteresis property. Accordingly, it becomes possible to cause the piezoelectric film 23 to perform a piezoelectric operation at a high voltage even when the thickness is thin.

[Second Embodiment]

Figure 3:
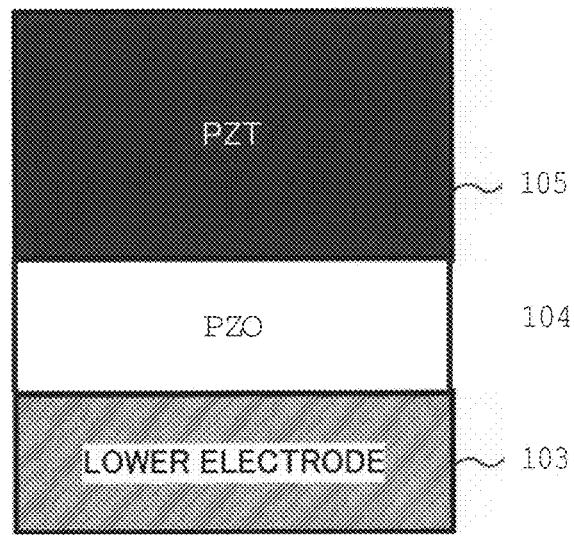
FIG. 3 is a schematic cross-sectional view for explaining a manufacturing method of the piezoelectric ceramics according to one aspect of the present invention.

FIG. 3 is a schematic cross-sectional view for explaining the manufacturing method of the piezoelectric ceramics according to one aspect of the present invention.

A substrate (not shown) is prepared. Various substrates may be used as the substrate, and examples thereof that can be used include a monocrystalline substrate such as a Si monocrystal or a sapphire monocrystal, a monocrystalline substrate on which a metal oxide film is formed, a substrate on which a polysilicone film or a silicide film is formed, and the like. In the present embodiment, a Si substrate oriented in the (100) plane is used.

Next, a $ZrO_2$ film (not shown) is formed on the Si substrate (not shown) by vapor deposition method at a temperature of 550° C. or less (preferably at a temperature of 500° C.). This $ZrO_2$ film is oriented in the (100) plane. Note that, when forming a $ZrO_2$ film at a temperature of 750° C. or more by vapor deposition method, the obtained $ZrO_2$ film is not oriented in the (100) plane.

In the present description, the orientation in the (100) plane is substantially the same as the orientation in the (200) plane.

Thereafter, a lower electrode 103 is formed on the $ZrO_2$ film. The lower electrode 103 is formed of an electrode film including a metal or an oxide. For example, a Pt film or an Ir film is used as the electrode including the metal. Examples of the electrode film including the oxide include a Sr$(Ti_{1-x}Ru_x)O_3$ film, and the x satisfies the following Formula 14.

$$0.01 \leq x \leq 0.4 \quad \text{Formula 14}$$

According to the present embodiment, a Pt film 103 through epitaxial growth is formed as the lower electrode on the $ZrO_2$ film by sputtering at a temperature of 550° C. or less (preferably at a temperature of 400° C.). This Pt film 103 is oriented in the (200) plane.

Next, a $PbZrO_3$ film (hereinafter, referred to as "PZO film") 104 is formed on the lower electrode 103. The PZO film 104 is an anti-ferroelectric film, and is formed by various methods such as a sol-gel method, a CVD method and a sputtering method. When forming the PZO film 104 by a sol-gel method, it is preferable to coat a precursor solution of PZO on a substrate and then crystallize under an oxygen atmosphere of 5 atm or more (preferably 7.5 atm or more). Lattice constants of the PZO are a=8.232 angstroms, b=11.776 angstroms, c=5.882 angstroms. The length of the a-axis is about twice of an average perovskite (ap≅4 angstroms), the length of the c-axis is c≅($\sqrt{2}$)ap, and the length of the b-axis is b≅2c. This change in the lattice constants of the PZO is fundamentally caused by making the b-axial period twice, through the rotation of the perovskite octahedral crystal and the addition of strain of the octahedron to the rotation.

Figure 12:
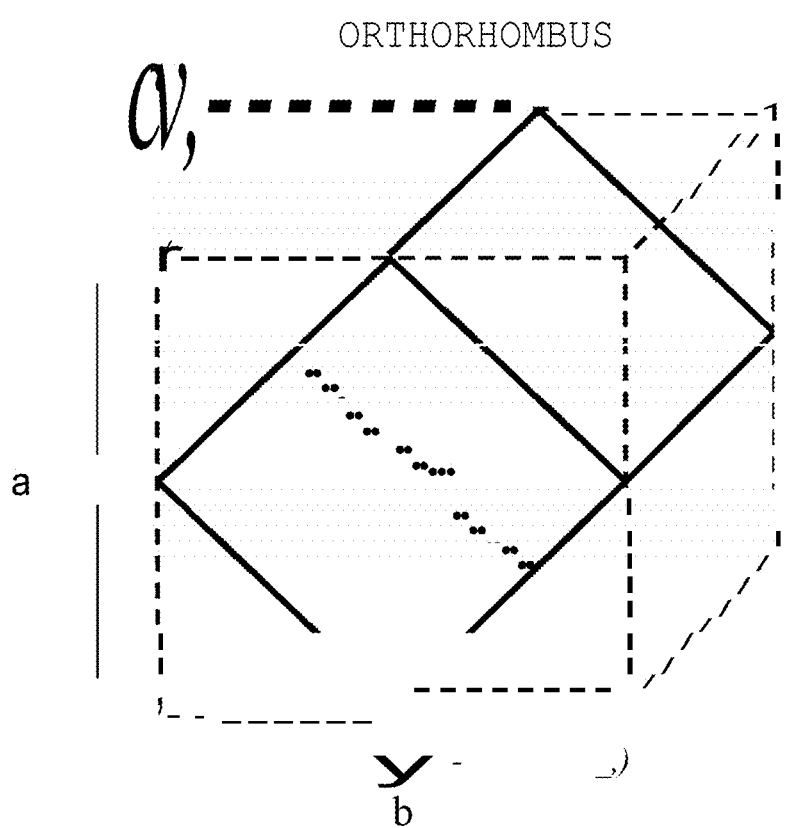
FIG. 12 is a diagram showing that a crystalline structure of PZO is an orthorhombus.

The PZO is an orthorhombus as shown in FIG. 12. Therefore, the PZO has apparently large lattice constants. The reason is that, since the perovskite rotates longitudinally by approximately 45°, the perovskite is treated as a large crystal by the fact that the circumference of the rotated crystal is surrounded as indicated by the dotted line. Namely, it is customary in the orthorhombus that the lengths of a-, b- and c-axis are treated so as to be apparently very long. The real PZO is a crystal shown by a solid line, and is an ordinary perovskite crystal.

Next, a PZT film 105 is formed on the PZO film 104. The PZT film 105 is a Pb$(Zr_{1-x}Ti_x)O_3$ film, and the x satisfies the following Formula 2'. The Pb$(Zr_{1-x}Ti_x)O_3$ film is a ferroelectric film and is oriented in the (100) plane.

$$0 < x < 1 \quad \text{Formula 2'}$$

Note that, in the present description, the "PZT film" includes a film of Pb(Zr, Ti)$O_3$ which contains impurities, and various impurities may be contained as long as the functions as the piezoelectric body of the PZT film are not extinguished even when adding the impurities.

Hereinafter, one example of a method for forming the PZT film will be explained in detail.

A sol-gel solution used for forming a PZT film is an El solution having a concentration of 10% by weight, in which butanol is a solvent and lead is added in an amount deficient by 70% to 90%.

When adding dimethylaminoethanol which is an alkaline alcohol having an amino group to the sol-gel solution, in a volume ratio of the El sol-gel solution:dimethylaminoethanol=7:3, the resulting solution exhibits a strong alkalinity of pH=12.

A PZT amorphous film is formed by a spin coating method, by using the above solution. The spin coater used is MS-A200 manufactured by MIKASA Co., Ltd. First, the spin coater is rotated at 800 rpm for 5 seconds and at 1500 rpm for 10 seconds, followed by gradually increasing the rotation rate to 3000 rpm in 10 seconds, the resulting film is allowed to stand on a hot plate (Ceramics Hot Plate AHS-300 manufactured by AS ONE Co., Ltd.) of 150° C. for 5 minutes in the atmosphere, is then allowed to stand on the hot plate (the above AHS-300) of 300° C. for 10 minutes in the atmosphere in the same way, and after that, is cooled to a room temperature. The PZT amorphous film having a desired thickness of 2000 nm is formed on the PZO film 104 by repeating these procedures 50 times. A plurality of the amorphous films is produced.

The above PZT amorphous film is formed by laminating a plurality of PZT amorphous films, and a ratio of Zr to Ti in the whole of the laminated PZT amorphous films may satisfy the following Formula 3;

$$55/45 \leq Zr/Ti. \qquad \text{Formula 3}$$

Note that each of the ratio of Zr/Ti of the plurality of PZT amorphous films may be the same or different. Even when the ratio is different from each other, the ratio of Zr to Ti in the whole of the plurality of laminated PZT amorphous films may satisfy the above Formula 3.

Next, a PZT film 105 obtained by crystallizing the PZT amorphous film is formed on the PZO film 104 by heat-treating the above PZT amorphous film under a pressurized oxygen atmosphere. Note that an example of a lattice constant of the PZT is 0.401 nm.

In the case where the thickness of the PZT film 105 is thin, it is preferable to form a hard PZT film by setting the ratio of Zr to Ti to a Ti rich side. The reason is that, even if the film thickness is formed so as to be small by using the PZT film having a Ti rich hard composition, it is possible for the film to perform an excellent piezoelectric operation since the whole of the PZT film does not become too hard. In contrast to this, in the case where the thickness of the PZT film 105 is thick, it is preferable to form a soft PZT film by setting the ratio of Zr to Ti to a Zr rich side. The reason is that, if the film thickness is formed so as to be large by using the PZT film having a Ti rich hard composition, it becomes difficult for the film to perform a piezoelectric operation since the whole of the PZT film becomes too hard.

Specifically, when the total thickness of the plurality of laminated PZT amorphous films is less than 1.0 μm, the ratio of Zr to Ti in the whole of the laminated PZT amorphous films preferably satisfies the following Formula 4.

$$55/45 \leq Zr/Ti \leq 65/35 \qquad \text{Formula 4}$$

In addition, when the total thickness of the plurality of laminated PZT amorphous films is not less than 1.0 μm, the ratio of Zr to Ti in the whole of the laminated PZT amorphous films preferably satisfies the following Formula 5.

$$60/40 \leq Zr/Ti \leq 75/25 \qquad \text{Formula 5}$$

Note that the thickness of the PZO film 104 is preferably 500 nm or less, more preferably 250 nm or less, and further preferably 100 nm or less.

Furthermore, it is possible for an element having the piezoelectric film according to the present embodiment to perform bipolar driving at a frequency of 100 Hz or more (preferably 500 Hz or more).

Note that, in the present embodiment, the PZT film 105 is formed by the sol-gel method, but the PZT film may be formed by a sputtering method.

Moreover, in the present embodiment, the piezoelectric film is constituted by using the PZO film 104 as the anti-ferroelectric film and by busing the PZT film 105 as the ferroelectric film, and the piezoelectric film may also be constituted by using an anti-ferroelectric film other than the PZO film and by using a ferroelectric film other than the PZT film.

According to the present embodiment, in the case of measuring the piezoelectric properties of the piezoelectric film having the PZO film 104 and the PZT film 105 and measuring the hysteresis property of the piezoelectric film, the voltage at which a piezoelectric butterfly curve takes a minimum value can be made larger than the coercive voltage Vc of the hysteresis curve since the ferroelectric film is disposed on the anti-ferroelectric film. Namely, even if a voltage which is larger than the coercive voltage Vc of the hysteresis curve of the piezoelectric film is applied, it is possible to cause the piezoelectric film to perform bipolar driving without including the electrostrictive factor in the piezoelectric hysteresis property. Accordingly, it becomes possible to cause the piezoelectric film to perform a piezoelectric operation at a high voltage even when the thickness of the piezoelectric film is thin.

In addition, according to the present embodiment, the piezoelectric property of the PZT film 105 can be improved by using the PZO film 104 as an initial nuclear layer (namely, buffer layer) of the PZT film 105. Specifically, the $PbZrO_3$ (PZO) is a case where a percentage of Ti is 0 (zero) in the phase diagram of $Pb(Zr_{1-x}Ti_x)O_3$ (PZT), and is an anti-ferroelectric body, but, since the c-axial length is the longest in the $Pb(Zr_{1-x}Ti_x)O_3$, the PZO acts in the direction of elongating the c-axial length of the all PZT, and thus the maximum piezoelectric performance that can be taken by the structure can be easily obtained. Namely, through the use of the PZO as the initial nucleus, the whole of the PZT is influenced by the crystalline axis of the PZO initial nucleus, and thus the c-crystalline axis becomes easily elongated in the whole of the PZT film, namely, becomes easily polarized, with the result that the piezoelectric property can be easily taken out.

Note that, according to the present embodiment, the PZO film 104 in which the percentage of Ti is 0 in the phase diagram of $Pb(Zr, Ti)O_3$ is formed on the lower electrode 103 and the $Pb(Zr_{1-x}Ti_x)O_3$ film 105 (Formula 2': 0<x<1) is formed on the PZO film 104, and the $Pb(Zr_{1-x}Ti_x)O_3$ film may be formed on a $Pb(Zr_{1-A}Ti_A)O_3$ film in which the percentage of Ti is very low. Provided that, the A and x satisfy the following Formulae 1 to 2. The $Pb(Zr_{1-x}Ti_x)O_3$ film is oriented in the (100) plane.

$$0 \leq A \leq 0.1 \qquad \text{Formula 1}$$

$$0.1 < x < 1 \qquad \text{Formula 2}$$

When the Formula 1 is satisfied, that is, the percentage of Ti is 10% or less, the $Pb(Zr_{1-A}Ti_A)O_3$ film which is used as the initial nucleus is the PZT of an anti-ferroelectric orthorhombus (namely, PZT in the orthorhombus region (ortho region) in the phase diagram of $Pb(Zr, Ti)O_3$), and thus the $Pb(Zr_{1-A}Ti_A)O_3$ acts in the direction of elongating the c-axial length of the all $Pb(Zr_{1-x}Ti_x)O_3$ (PZT) to thereby be able to give the same effects as in the above embodiment.

[Third Embodiment]

Figure 4:
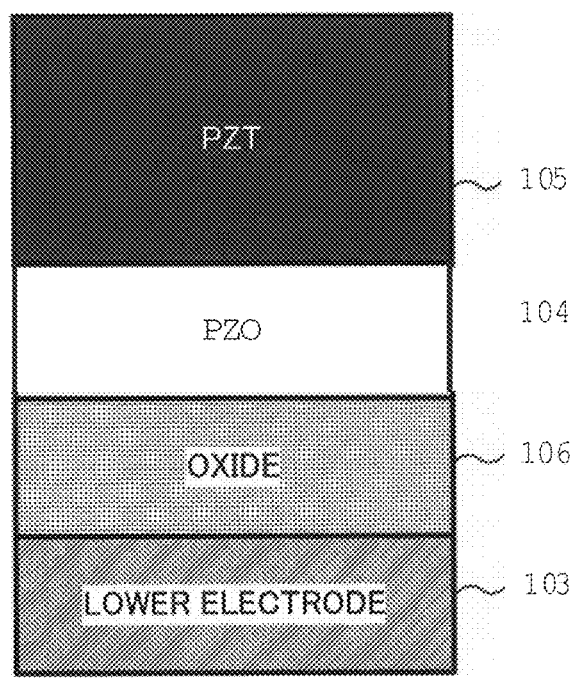
FIG. 4 is a schematic cross-sectional view for explaining a manufacturing method of the piezoelectric ceramics according to one aspect of the present invention.

FIG. 4 is a schematic cross-sectional view for explaining the manufacturing method of the piezoelectric ceramics according to one aspect of the present invention, and the same symbols are attached to the same parts as in FIG. 3.

The Si substrate (not shown), the $ZrO_2$ film (not shown) and the lower electrode 103 are formed in the same way as in the first embodiment, and thus the explanation thereof is omitted.

Next, an oxide film 106 is formed on the lower electrode 103. The oxide film 106 may preferably be an oxide having a perovskite structure and is, for example, a $Sr(Ti, Ru)O_3$ film. The $Sr(Ti, Ru)O_3$ film is a $Sr(Ti_{1-x}Ru_x)O_3$ film in which the x satisfies the following Formula 14, and is formed by a sputtering method. At this time, a sintered $Sr(Ti_{1-x}Ru_x)O_3$ body is used as a sputtering target. Provided that, the x satisfies the following Formula 14.

$$0.01 \leq x \leq 0.4 \text{ (preferably } 0.05 \leq x \leq 0.2) \quad \text{Formula 14}$$

Note that the reason why the x of the $Sr(Ti_{1-x}Ru_x)O_3$ film is 0.4 or less is because the $Sr(Ti_{1-x}Ru_x)O_3$ film becomes powdery and thus is not solidified enough, when the x is more than 0.4.

Thereafter, the $Sr(Ti_{1-x}Ru_x)O_3$ film is crystalized by the RTA (Rapid Thermal Anneal) under a pressurized oxygen atmosphere. The $Sr(Ti_{1-x}Ru_x)O_3$ film is a composite oxide of strontium, titanium and ruthenium, and has the perovskite structure.

Next, the PZO film 104 is formed on the oxide film 106 in the same way as in the second embodiment. Subsequently, the PZT film 105 is formed on the PZO film 104 in the same way as in the second embodiment. The PZT film 105 is oriented in the (100) plane.

In the present embodiment, the same effects as in the second embodiment can be obtained.

Note that, according to the present embodiment, the PZO film 104 is formed on the oxide film 106 and the PZT 105 is formed on the PZO film 104, and the $Pb(Zr_{1-x}Ti_x)O_3$ film may be formed on a $Pb(Zr_{1-A}Ti_A)O_3$ film having a very low percentage of Ti. Provided that, the A and x satisfy the following Formulae 1 to 3. The $Pb(Zr_{1-x}Ti_x)O_3$ film is in the (100) plane.

$$0 \leq A \leq 0.1 \quad \text{Formula 1}$$

$$0.1 < x < 1 \quad \text{Formula 2}$$

$$A < x \quad \text{Formula 3}$$

The same effects as in the second embodiment can be obtained by satisfying the Formula 1.

In addition, in the present embodiment, although the $Sr(Ti, Ru)O_3$ film is used as the oxide film 106, a $SrRuO_3$ film may also be used as the oxide film 106.

Note that the above first to third embodiments may be carried out by appropriate combination thereof.

EXAMPLE

Figure 5A:
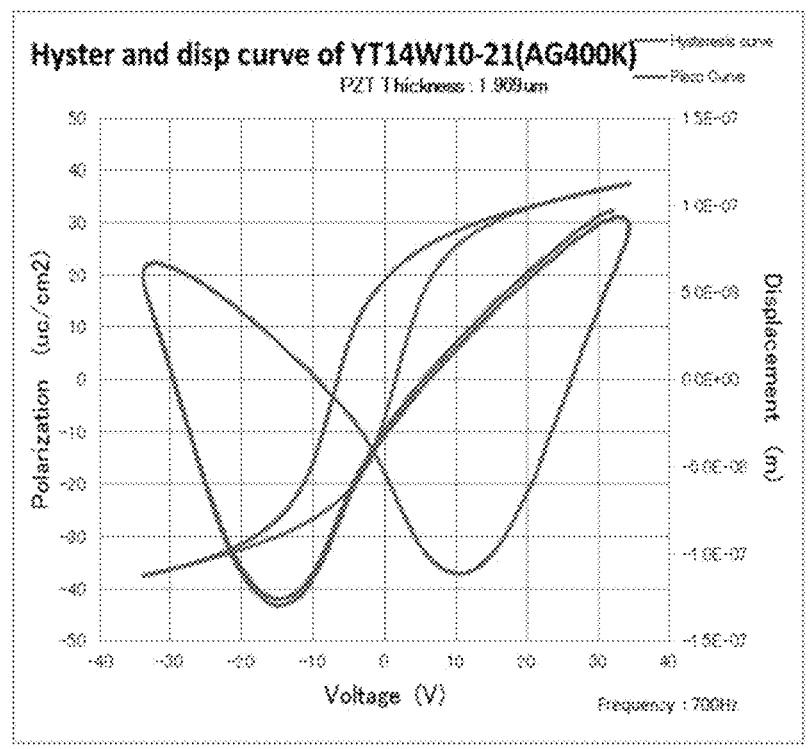
Figure 5B:
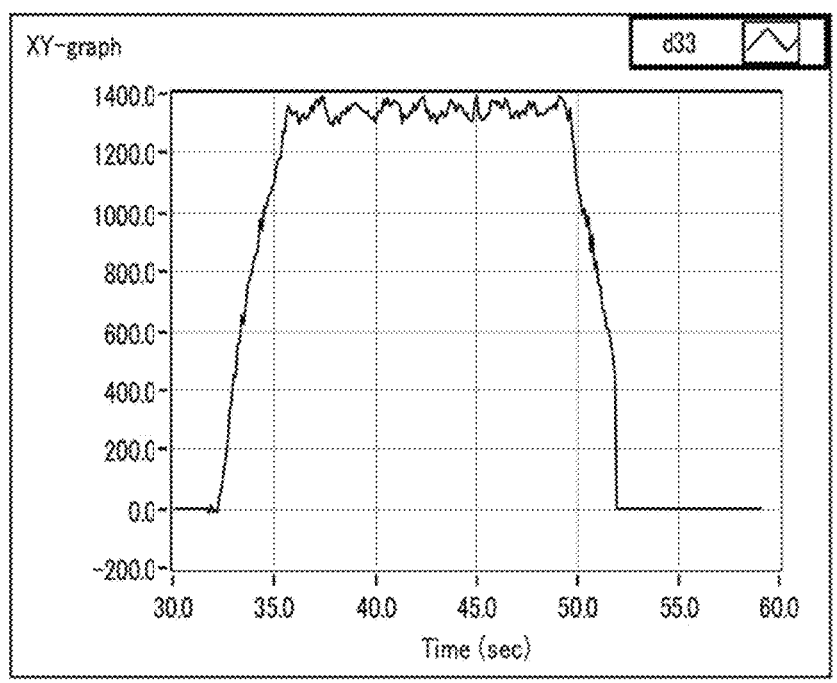
Figure 5D:
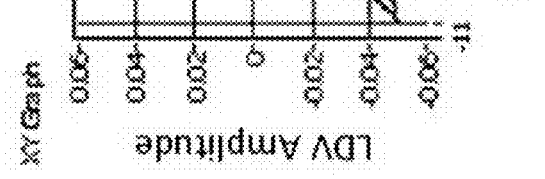
Figure 5D:
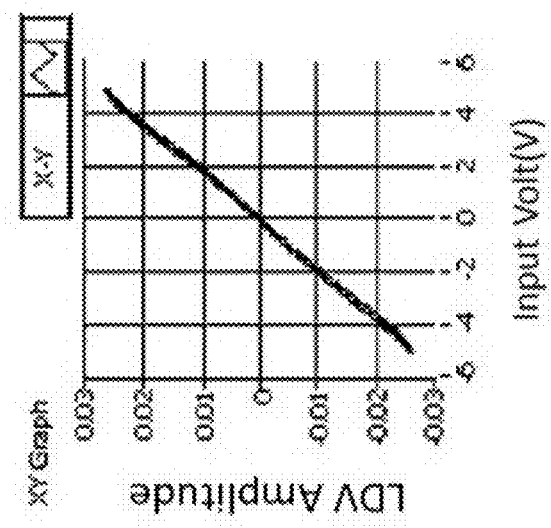
Figure 5D:
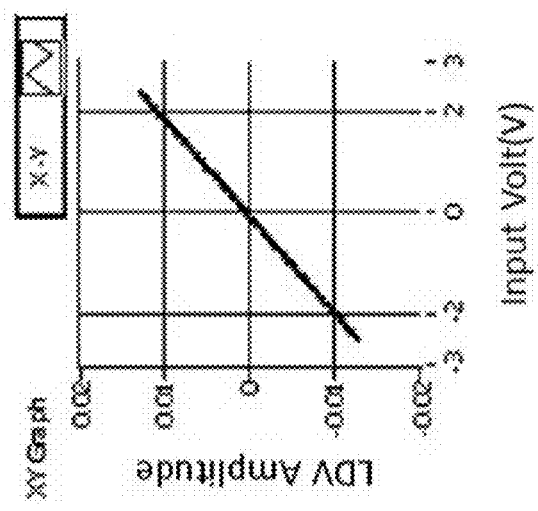

FIG. 5A is a graph showing the DE hysteresis curve and the piezoelectric butterfly curve of the piezoelectric film of Sample 1 according to the Example. FIG. 5B is a graph showing the result of measurement of the piezoelectric property d33 of the piezoelectric film. FIG. 5D are graphs showing the piezoelectric hysteresis curves obtained by applying voltages of ±2.5 V, ±5 V, ±10 V at a frequency of 700 Hz, respectively, to the piezoelectric film and thus causing the film to perform bipolar driving, and the like.

The manufacturing method of the piezoelectric film of Sample 1 is as follows.

A $ZrO_2$ film was formed by a reactive vapor deposition method on a Si substrate 11 of 6 inches, having (100) crystal plane. The vapor deposition conditions are shown in Table 1. The $ZrO_2$ film was oriented in the (100) plane.

Subsequently, a Pt film having a thickness of 100 nm was formed on the $ZrO_2$ film by sputtering method. The film forming conditions at this time are shown in Table 1. The Pt film was oriented in the (200) plane.

TABLE 1

| | Example | |
|---|---|---|
| Process | Vapor deposition | DC-Sputtering |
| Depo Vac | 6.90E−03 | 3.20E−02 |
| Depo Source | Zr + O2 | Pt |
| ACC/Emission | 7.5 kV/1.50 mA | DC/100 W |
| Total Thickness (nm) | 13.4 | 100 |
| Depo Time (sec) | 930 | 720 |
| SV deg (Tsub) | 500° C. | 400° C. |
| MFC O2 | 5 sccm | Ar: 16 sccm |

Next, there was formed, on the Pt film, a laminated film obtained by laminating a $PbZrO_3$ film (hereinafter, referred to as "PZO film") and a $Pb(Zr_{0.55}Ti_{0.45})O_3$ film (hereinafter, referred to as "PZT film") in this order. Specifically, the PZO film having a thickness of 250 nm was formed on the Pt film by a sol-gel method. The conditions at this time are as follows.

A raw material solution was obtained by mixing a MOD solution for forming $1.3PbZrO_3$ at a concentration of 1.4 mol/kg (manufactured by TOYOSHIMA SEISAKUSHO), ethanol and 2-n-butoxyethanol to thereby set these mixed substances to be 1000 ml (mixing at a ratio of 1:1:1, respectively), adding thereto 20 g of a white powder of polyvinylpyrrolidone (K-30 manufactured by NIPPON SHOKUBAI), and then dissolving the resultant substance with stirring. 3 ml of the solution was dropped on a wafer of 6 inches, a resultant substance was coated by rotary coating at 3000 rpm for 10 seconds, and after being held on a hot plate of 150° C. for 30 seconds and then being held on a hot plate of 250° C. for 90 seconds, sintering was carried out at 600° C. for 3 minutes under an $O_2$ atmosphere of 1 atm.

Subsequently, a PZT film having a thickness of 2 µm was formed on the PZO film by the sol-gel method. The detailed formation method was as follows.

A PZT precursor solution was prepared. The PZT precursor solution was a precursor solution which contains, in an organic solvent, a metal compound containing all or a part of the metallic components of the PZT crystal and its partial polycondensation product, and was a 25% by weight of PZT (Zr/Ti=70/30) in which Pb is contained in 20% excessive amount. Next, a first layer of coating film was formed on the PZO film by coating the PZT precursor solution on the PZO film, by spin-coating method. Specifically, 500 µl of the PZT precursor solution was coated on the PZO film, the rotation for the spin-coating was elevated from 0 to 500 rpm in 3 seconds, the rotation was carried out at 1500 rpm for 20 seconds after being held at 500 rpm for 5 seconds, and then the rotation was stopped. Next, the coated PZT precursor solution was dried while being heated to 250° C. for 30 seconds on a hot plate and thus water content was removed, and further the resultant coating layer was temporarily calcined while being heated to 450° C. for 60 seconds on a hot plate kept at a high temperature. In this way, the first layer of the PZT (70/30) film was formed on the PZO film.

Next, in the same way as above, the rotation coating, drying, and temporary calcination were repeated seven times. Note that, although the target film thickness of each of the first layer to the eighth layer was 250 nm, the resulting film thickness after the temporary calcination was 240 nm.

Next, after the temporary calcination, the PZT amorphous films of the first layer to the eighth layer were subjected to anneal treatment by maintaining a temperature of 700° C. for 3 minutes under a 10 atm oxygen atmosphere by using a pressurized Lamp annealing apparatus (RTA: rapidly thermal anneal) to thereby perform PZT crystallization. The crystallized PZT film is formed by the perovskite structure.

Next, the piezoelectric properties of the above piezoelectric film was measured, the DE hysteresis property was measured, the piezoelectric property d33 was measured, and the piezoelectric hysteresis property was measured by applying voltages of ±2.5 V, ±5 V, ±10 V at a frequency of 700 Hz, respectively, to the piezoelectric film and thus causing the piezoelectric film to perform bipolar driving. These measurement results are shown in FIG. 5C.

Figure 6:
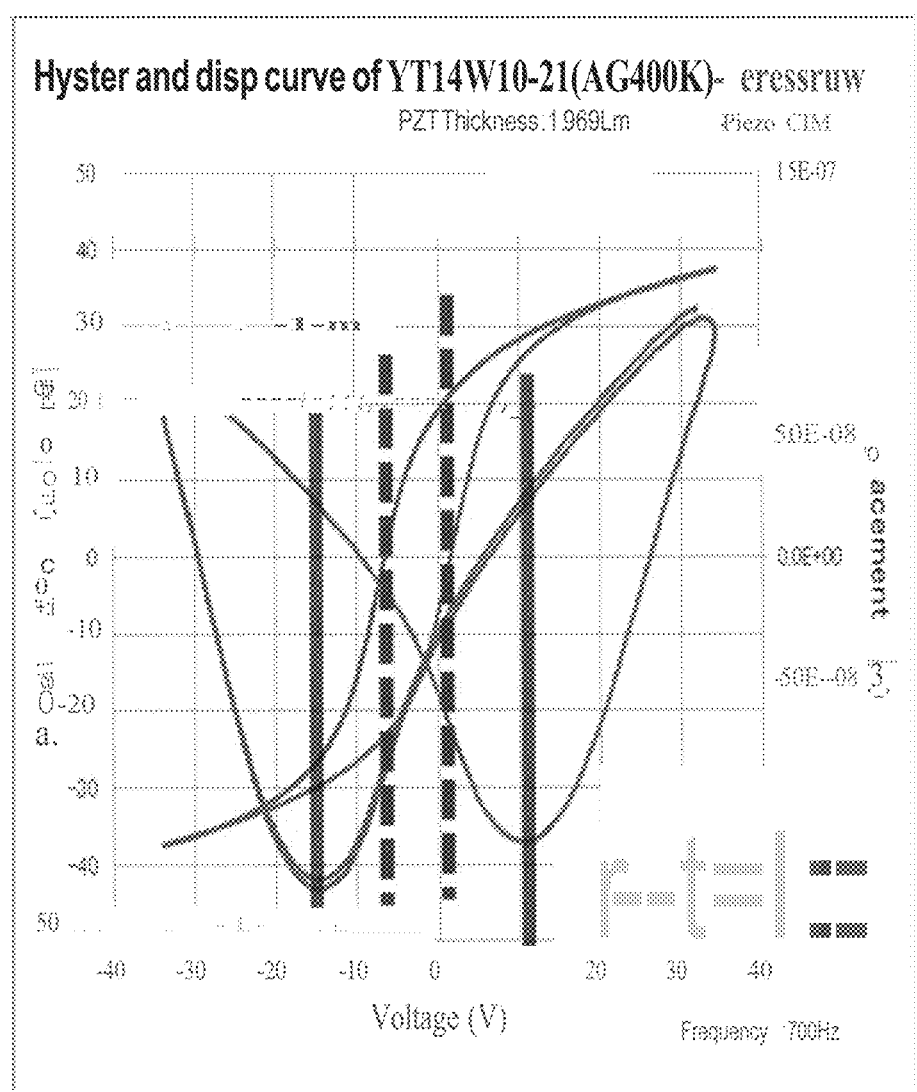
FIG. 6 is a graph in which the straight lines and the dotted lines are illustrated onto the graph in FIG. 5 for easily explaining the fact that the voltage at which the piezoelectric butterfly curve takes the minimum value is larger by 2 V or more, than the coercive voltage Vc of the DE hysteresis curve.

FIG. 6 is a graph in which the straight lines and the dotted lines are illustrated onto the graph of the DE hysteresis curve and the piezoelectric butterfly curve of the piezoelectric film of Sample 1 shown in FIG. 5 in order to easily understand that the voltage at which the piezoelectric butterfly curve takes the minimum value is larger by 2 V or more, than the coercive voltage Vc of the DE hysteresis curve.

As shown in FIG. 6, in the piezoelectric film of Sample 1, it is evident that the voltage at which the piezoelectric butterfly curve takes the minimum value is larger by approximately 10 V than the coercive voltage Vc of the DE hysteresis curve. Therefore, as shown in FIG. 5, it has been able to be confirmed that, even when causing the piezoelectric film to perform bipolar driving by applying a voltage of ±10 V which is larger than the coercive voltage Vc of the hysteresis curve of the piezoelectric film of Sample 1, the electrostrictive factor cannot be included in the piezoelectric hysteresis property. Accordingly, it is said to be possible to cause the piezoelectric film to perform a piezoelectric operation at a high voltage even when the thickness of the piezoelectric film is thin.

Figure 7A:
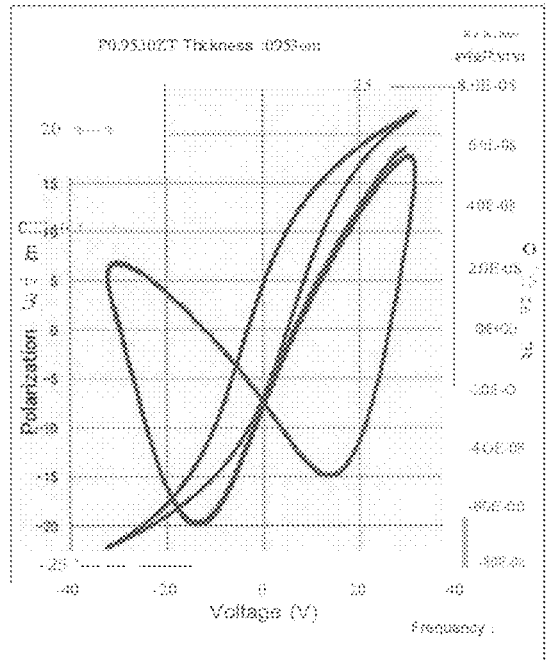
FIG. 7(A) is a graph showing the DE hysteresis curve and the piezoelectric butterfly curve of the piezoelectric film of Sample 2 according to Example.
Figure 7B:
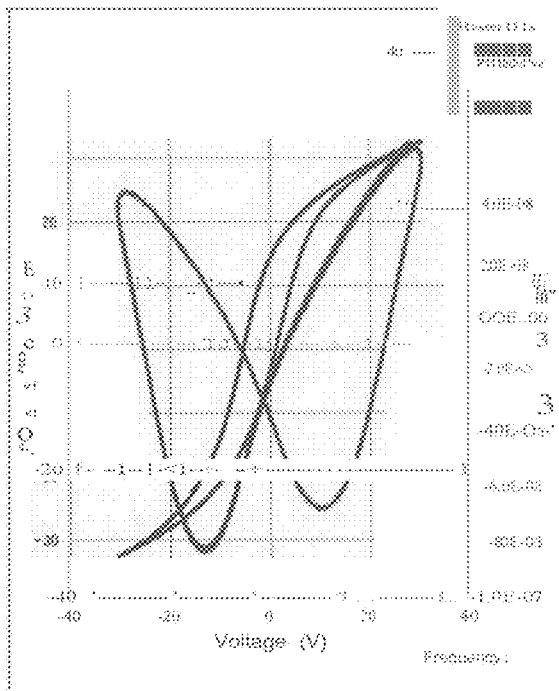
FIG. 7(B) is a graph showing the DE hysteresis curve and the piezoelectric butterfly curve of the piezoelectric film of Sample 3 according to Example.
Figure 8A:
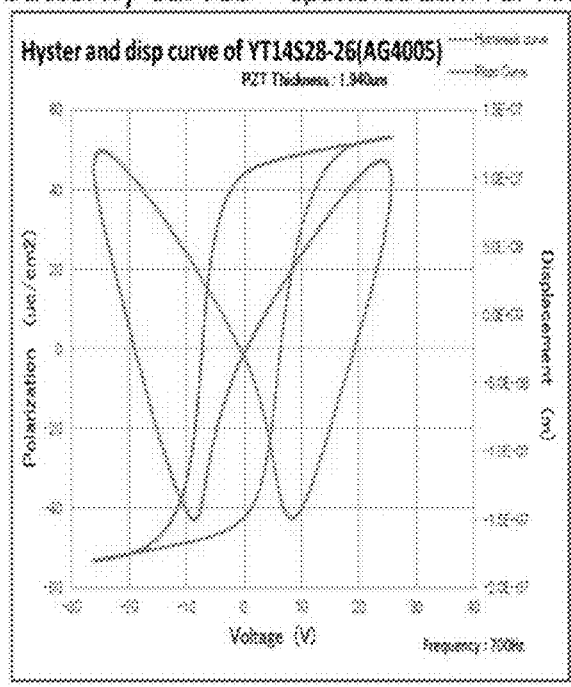
FIG. 8(A) is a graph showing the DE hysteresis curve and the piezoelectric butterfly curve of the PZT film having a thickness of 2 μm.
Figure 8B:
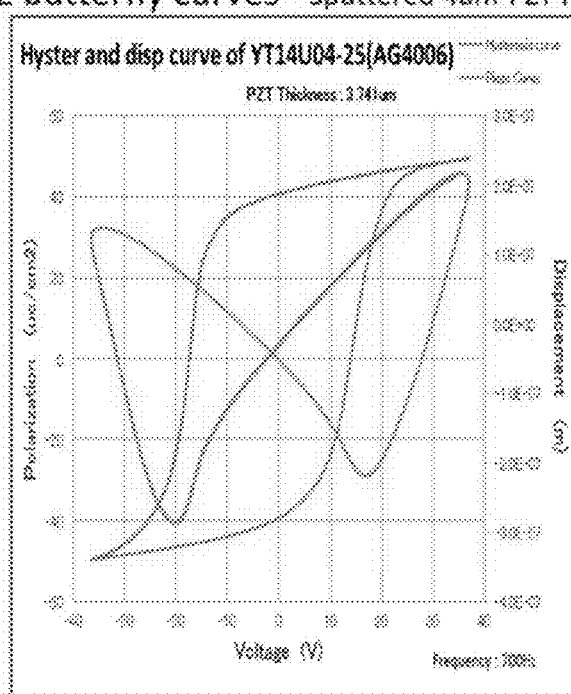
FIG. 8(B) is a graph showing the DE hysteresis curve and the piezoelectric butterfly curve of the PZT film having a thickness of 4 μm.
Figure 9:
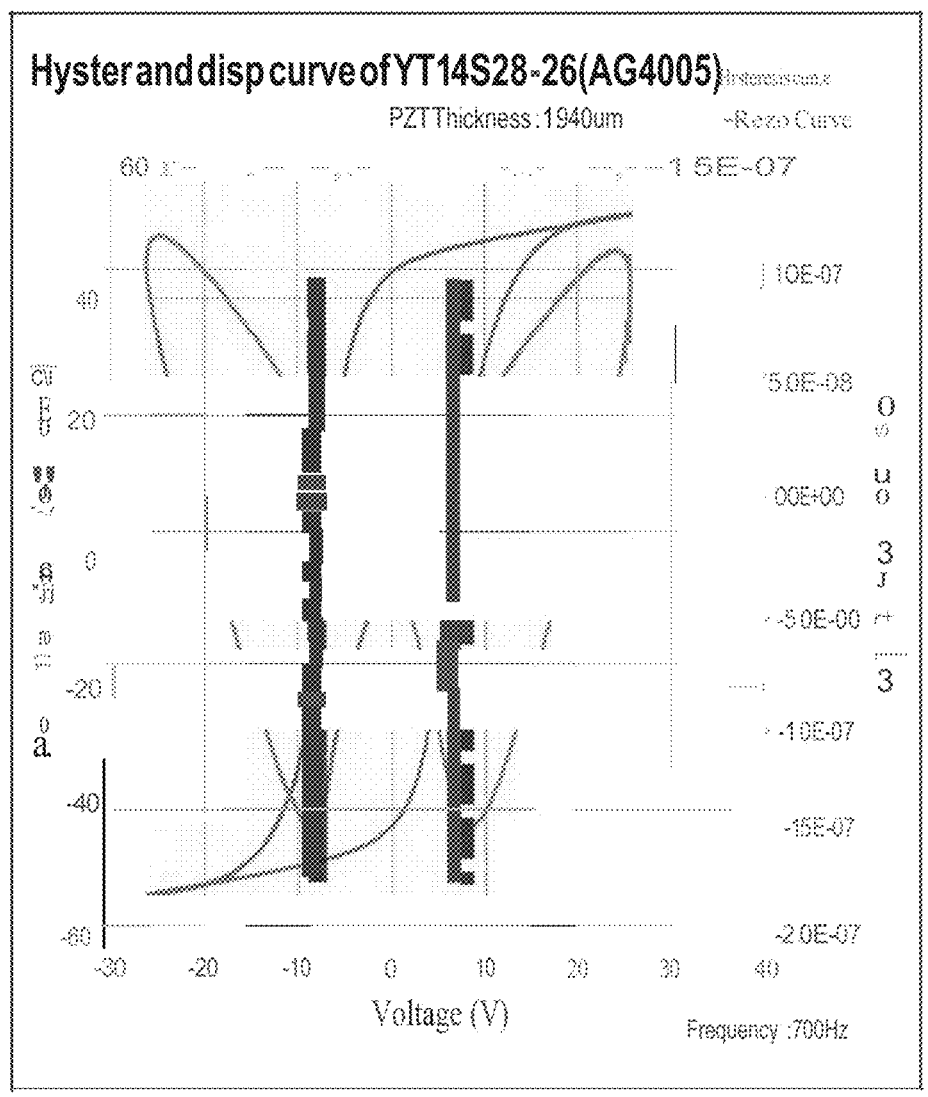
FIG. 9 is a graph which is the same as of FIG. 8(A) and which shows that the voltage at which the piezoelectric butterfly curve takes the minimum value is almost the same as the coercive voltage Vc of the DE hysteresis curve.
Figure 10A:
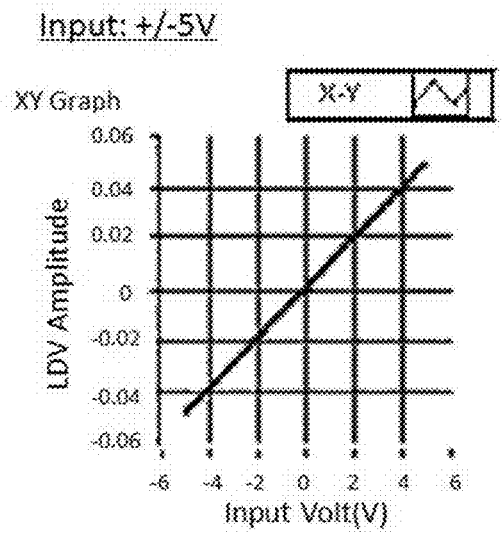
FIG. 10(A) is a graph showing the piezoelectric hysteresis curve obtained by applying a voltage of ±5 V, 700 Hz to Sample 1 and thus causing the Sample 1 to perform bipolar driving.
Figure 10B:
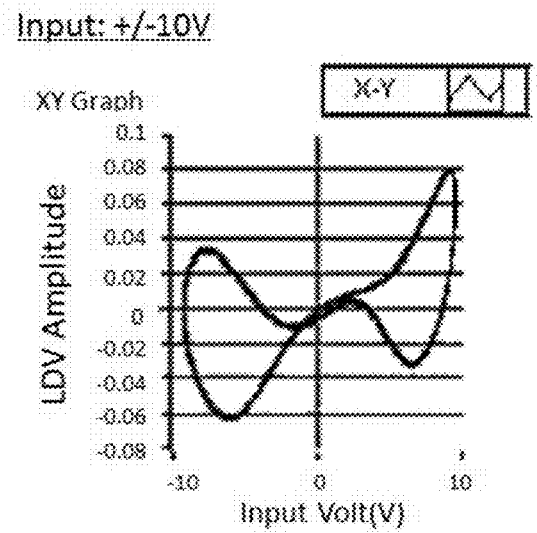
FIG. 10(B) is a graph showing the piezoelectric hysteresis curve obtained by applying a voltage of ±10 V, 700 Hz to Sample 1 and thus causing the Sample 1 to perform bipolar driving.
Figure 11A:
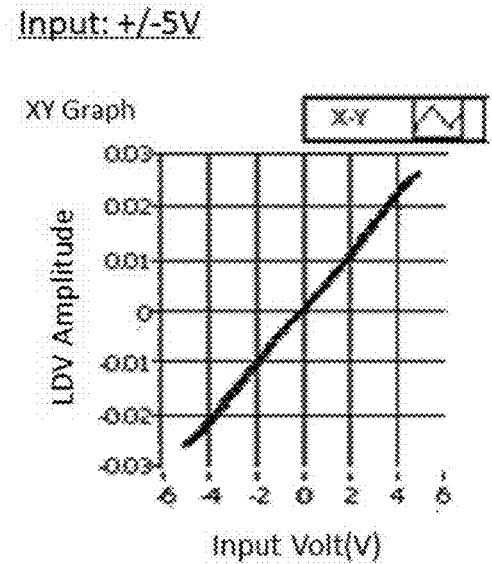
FIG. 11(A) is a graph showing the piezoelectric hysteresis curve obtained by applying a voltage of ±5 V, 700 Hz to Sample 2 and thus causing the Sample 2 to perform bipolar driving.
Figure 11B:
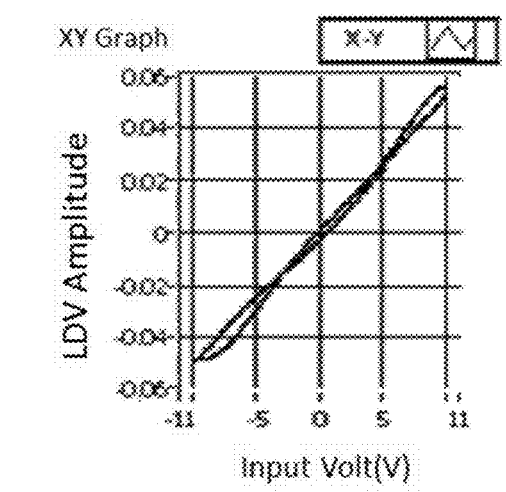
FIG. 11(B) is a graph showing the piezoelectric hysteresis curve obtained by applying a voltage of ±10 V, 700 Hz to Sample 2 and thus causing the Sample 2 to perform bipolar driving.

FIG. 7(A) is a graph showing the DE hysteresis curve and the piezoelectric butterfly curve of the piezoelectric film of Sample 2 according to Example, and FIG. 7(B) is a graph showing the DE hysteresis curve and the piezoelectric butterfly curve of the piezoelectric film of Sample 3 according to Example.

The manufacturing methods of Samples 2 and 3 were the same as the manufacturing method of Sample 1 except that the thickness of the PZT film was changed by the change of the repetition times of the rotation coating, the drying and the temporary calcination of the PZT (70/30) film in the manufacturing method of the piezoelectric film of the Sample 1 described above. Note that the thickness of the PZT film of Sample 1 was 1.969 μm, the thickness of the PZT film of Sample 2 was 0.953 μm, and the thickness of the PZT film of Sample 3 was 0.797 μm.

As shown in FIGS. 7(A) and (B), in the piezoelectric films of Samples 2 and 3, it is found that the voltage at which the piezoelectric butterfly curve takes the minimum value is larger by approximately 10 V than the coercive voltage Vc of the DE hysteresis curve. Therefore, even when causing the piezoelectric films to perform bipolar driving by applying a voltage which is larger than the coercive voltage Vc of the hysteresis curve also in the piezoelectric films of Samples 2 and 3, the electrostrictive factor could not be included in the piezoelectric hysteresis property. Accordingly, it becomes possible to cause the piezoelectric film to perform a piezoelectric operation at a high voltage even when the thickness of the piezoelectric film is thin.

EXPLANATION OF SYMBOLS

21 Anti-ferroelectric film
22 Ferroelectric film
23 Piezoelectric film
103 Lower electrode
104 PbZrO$_3$ film (PZO film)
105 PZT film
106 Oxide film

The invention claimed is:

1. A piezoelectric film, wherein a voltage at which a piezoelectric butterfly curve that is a result obtained by measuring a piezoelectric property of a piezoelectric film takes a minimum value is larger by 2 V or more than a coercive voltage of a hysteresis curve that is a result obtained by measuring a hysteresis property of said piezoelectric film,
   wherein said piezoelectric film comprises an anti-ferroelectric film, and a ferroelectric film formed on said anti-ferroelectric film.

2. The piezoelectric film according to claim 1, wherein said
   anti-ferroelectric film is a Pb(Zr$_{1-A}$Ti$_A$)O$_3$ film,
   said ferroelectric film is a Pb(Zr$_{1-x}$Ti$_x$)O$_3$ film, and
   said A and said x satisfy the following Formula 1 and Formula 2;

$0 \leq A \leq 0.1$　　　　Formula 1

$0.1 < x < 1$.　　　　Formula 2

3. The piezoelectric film according to claim 2, wherein said Pb(Zr$_{1-x}$Ti$_x$)O$_3$ film is a film which is formed by laminating a plurality of Pb(Zr, Ti)O$_3$ films having different Zr/Ti ratios, and a ratio of Zr to Ti in the whole of said laminated films satisfies the following Formula 3;

$55/45 \leq Zr/Ti$.　　　　Formula 3

4. The piezoelectric film according to claim 3, wherein
   when a thickness of said laminated films is less than 1.0 μm, a ratio of Zr to Ti in the whole of said laminated films satisfies the following Formula 4, and
   when a thickness of said laminated films is 1.0 μm or more, a ratio of Zr to Ti in the whole of said laminated films satisfies the following Formula 5;

$55/45 \leq Zr/Ti \leq 65/35$　　　　Formula 4

$60/40 \leq Zr/Ti \leq 75/25$.　　　　Formula 5

5. The piezoelectric film according to claim 2 wherein
   said A is 0, and
   said Pb(Zr$_{1-A}$Ti$_A$)O$_3$ is a PbZrO$_3$ film.

6. The piezoelectric film according to claim 1 wherein an element having said piezoelectric film can be caused to perform bipolar diving at a frequency of 100 Hz or more.

7. Piezoelectric ceramics comprising the piezoelectric film according to claim 2, and
   an oxide film formed under said Pb(Zr$_{1-A}$Ti$_A$)O$_3$ film.

8. The piezoelectric ceramics according to claims 7, wherein said oxide film is a SrRuO$_3$ film or a Sr(Ti, Ru)O$_3$ film.

9. The piezoelectric ceramics according to claim 7 further comprising an electrode film formed under said Pb(Zr$_{1-A}$Ti$_A$)O$_3$ film.

10. The piezoelectric ceramics according to claim 9, wherein said electrode film comprises an oxide or a metal.

11. The piezoelectric ceramics according to claim 9, wherein said electrode film is a Pt film of an Ir film.

12. The piezoelectric ceramics according to claim 9, further comprising a $ZrO_2$ film formed under said electrode film.

13. The piezoelectric ceramics according to claim 12, further comprising a Si substrate formed under said $ZrO_2$ film.

\* \* \* \* \*